TRANSISTOR PUSH-PULL AMPLIFYING CIRCUIT-ARRANGEMENTS

Filed Feb. 29, 1956

INVENTOR
JOHANNES ENSINK
ANNE KLAASSEN
BY [signature]
AGENT

United States Patent Office 2,931,986

Patented Apr. 5, 1960

2,931,986

TRANSISTOR PUSH-PULL AMPLIFYING CIRCUIT-ARRANGEMENTS

Johannes Ensink and Anne Klaassen, Hilversum, Netherlands, assignors, by mesne assignments, to North American Philips Company, Inc., New York, N.Y., a corporation of Delaware Application February 29, 1956, Serial No. 568,667

Claims priority, application Netherlands March 2, 1955

4 Claims. (Cl. 330—15)

This invention relates to amplifying circuit-arrangements, in which the signal oscillations to be amplified are supplied through an input transformer to two push-pull connected transistors, preferably in class B-setting, which are alternately non-conductive during a part of the oscillation phenomenon. It has been found that in such circuit arrangements undue higher harmonics of the signal oscillations to be amplified are likely to occur.

The present invention is based on the recognition that said harmonics result from the transistor input circuits alternately becoming conductive and non-conductive so that harmonics produced in the input current may excite the resonant circuit comprising the input transformer (as the case may be with its input impedance) and the apparent capacities occurring between the bases and the emitters of the transistors.

The invention has for its object to provide a simple means for mitigating said disadvantages and is characterized in that in order to suppress higher harmonics of the signal oscillations, which harmonics result from the transistors alternately becoming conductive and non-conductive, an impedance, which is low with respect to the signal frequencies but high with respect to said higher harmonics to be suppressed, is connected in a common circuit between the input transformer and corresponding electrodes of the two transistors.

In order that the invention may be readily carried into effect, it will now be described in detail, by way of example, with reference to the accompanying drawing, in which Fig. 1 is a schematic diagram of an embodiment of the circuit arrangement of the present invention;

Figure 1:
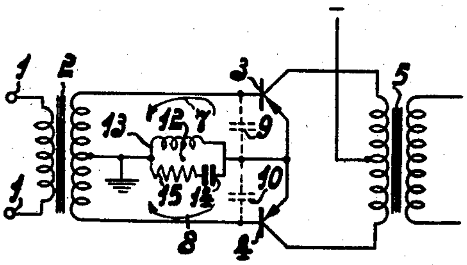

In Fig. 1 the signal oscillations to be amplified, which have a wide frequency band and occur at the terminals 1, are supplied through a transformer 2 to two push-pull connected transistors 3 and 4 in order to produce signal oscillations which are amplified through a push-pull output transformer 5. Owing to the absence of a source of bias voltage between the emitter and base the transistors 3 and 4 are approximately in class B setting, that is to say, that they are alternately conductive and non-conductive during half the oscillation time of the signal oscillations.

Figure 2:
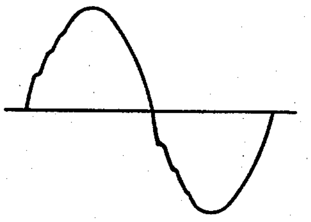
Figs. 2, 3 and 4 are current versus time diagrams to explain the operation of the circuit-arrangement shown in Fig. 1.
Figure 3:
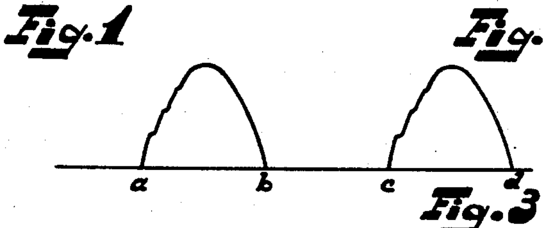
Figure 4:
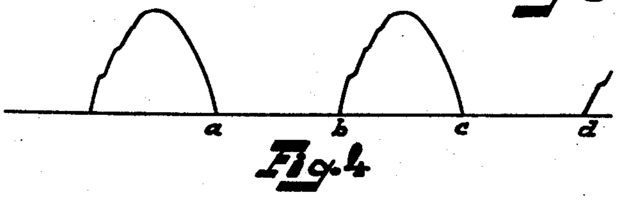

It has been found that the oscillations produced through the transformer 5 may comprise an undue strong harmonic (ripple) as shown in Fig. 2 for sinusoidal excitation. This phenomenon can be explained as a result of said recognition, since, as shown in Figs. 3 and 4 respectively currents pass through the closed loops 7 and 8 respectively, which currents produce a large number of higher harmonics at the instants *a, b, c, d* at which the transistors pass over from the conductive to the non-conductive state or conversely. Said currents excite the resonant circuits comprising the inductances of the input transformer 2 and the apparent capacities 9 and 10 respectively between the emitters and the bases of the transistors 3 and 4 with the result that the harmonic corresponding to the resonant frequency of said series-circuits occurs with a considerable amplitude across the output transformer 5.

By providing an impedance 12, having a value which is low with respect to the signal frequencies but high with respect to the harmonic concerned, said harmonic in comparison with the signal, is largely suppressed. To this end the impedance 12 preferably is a damped parallel resonant-circuit which is tuned to the harmonic concerned and comprises an inductance 13, a capacitor 14 and a damping resistor 15. In a practical example, in which the signal frequency was 4 kc./s. and the ripple 40 to 60 kc./s., an inductance 13 to 1 millinhenry having a natural resistance of 20 ohms, a capacitor 14 of 30,000 micromicrofarads and a resistor 15 of 300 ohms were used.

Figure 5:
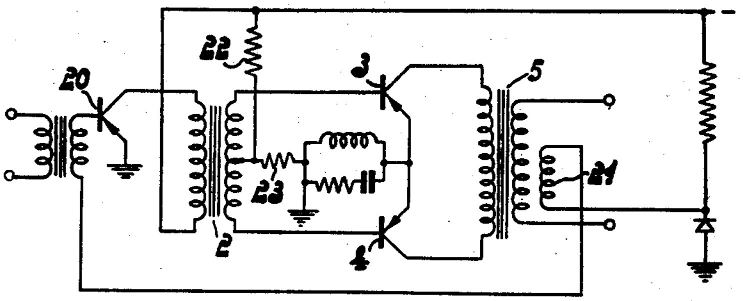
Fig. 5 is a schematic diagram of a circuit arrangement embodying the circuit arrangement of Fig. 1.

In Fig. 5, the circuit arrangement shown in Fig. 1 moreover comprises a preamplifier 20 on which acts an inverse feedback voltage set up at a winding 21 of the transformer 5. By phase-displacement in the several amplification stages, a reactance becomes operative apparently in parallel with the transformer 2, by which reactance the frequency of the harmonic (ripple) to be suppressed is shifted. The resonant frequency of the circuit 12 then should correspond to said shifted frequency. The voltage divider 22, 23 permits an accurate B-setting and alternatively for example, AB-setting of the transistors 3 and 4.

Figure 6:
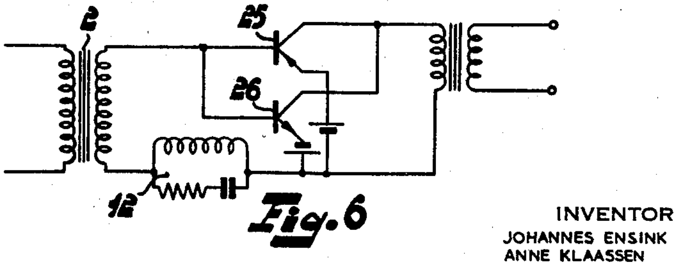
Fig. 6 is a modification of the circuit arrangement of Fig. 1.

The variant shown in Fig. 6 comprises two transistors 25 and 26 of opposite conductivity type, so that the input transformer 2 may in itself be a single-phase transformer. However, the effects described with reference to Figs. 2, 3 and 4 remain the same and can be suppressed by means of a similar impedance 12.

What is claimed is:

1. An amplifier circuit arrangement comprising a pair of transistors each having an emitter electrode, a base electrode forming with said emitter electrode an input electrode system, a collector electrode forming with one of said first-mentioned electrodes an output electrode system, the base and emitter electrodes of each transistor exhibiting apparent capacities, said transistors being connected in push-pull circuit arrangement means connecting said emitter electrodes, transformer means for applying an input signal to the input electrode systems of said transistors, each of the transistors alternately conducting over successive half cycles, means for substantially eliminating a selected harmonic of said signal frequency produced by the resonant circuit formed by said transformer and said capacities comprising an impedance member connected in common in the input electrode systems of said transistors between a point on said connecting means and a point on said transformer means, said impedance member having a relatively low impedance at the frequency of said input signal and having a relatively high impedance at the frequency of said selected harmonic of said signal, and means for deriving an output signal in common from the output electrode systems of said transistors.

2. An amplifier circuit arrangement comprising a pair of transistors each having an emitter electrode, a base electrode forming with said emitter electrode an input electrode system, a collector electrode forming with said emitter electrode an output electrode system, the base and emitter electrodes of each transistor exhibiting apparent capacities, said transistors being connected in push-pull circuit arrangement means connecting said emitter electrodes, transformer means for applying an input signal to the input electrode systems of said transistors, each of said transistors alternately conducting over successive half cycles, means for substantially eliminating a selected harmonic of said signal frequency produced by the resonant circuit formed by said transformer and said capacities comprising a damped parallel resonant circuit connected in common in the input electrode systems of said transistors between a point on said connecting means and a point on said transformer means, said resonant circuit haping a relatively low impedance at the frequency of said input signal and having a resonant frequency at the frequency of said selected harmonic of said signal frequency, and transformer means for deriving an output signal in common from the output electrode systems of said transistors.

3. An amplifier circuit arrangement comprising a pair of transistors each having emitter, collector and base electrodes, the base and emitter electrodes of each transistor exhibiting apparent capacities, means for applying an input signal to said transistors comprising an input transformer having a primary winding, a secondary winding and a center tap on said secondary winding, means connecting the base electrodes of said transistors through said secondary winding, means connecting the emitter electrodes of said transistors, each of said transistors alternately conducting over successive half cycles, means for substantially eliminating a selected harmonic of said signal frequency produced by the resonant circuit formed by said transformer and said capacities comprising a damped parallel resonant circuit connected between said center tap and said emitter electrode connecting means, said resonant circuit having a relatively low impedance at the frequency of said input signal and having a resonant frequency at the frequency of a selected harmonic of said signal frequency, means for deriving an output signal from said transistors comprising an output transformer having a primary winding and a secondary winding, and means connecting the collector electrodes of said transistors through the primary winding of said output transformer.

4. An amplifier circuit arrangement comprising a pair of transistors of opposite conductivity type, each having an emitter electrode, a base electrode forming an emitter-base path with said emitter electrode, a collector electrode forming an emitter-collector path with said emitter electrode, the base and emitter electrodes of each transistor exhibiting apparent capacities, means for applying an input signal to said transistors comprising an input transformer having a primary winding and a secondary winding, means connecting the emitter-base paths of said transistors in parallel across said secondary winding, each of said transistors alternately conducting over successive half cycles, means for substantially eliminating a selected harmonic of said signal frequency produced by the resonant circuit formed by said transformer and said capacities comprising a damped parallel resonant circuit interposed in said last-mentioned means between said secondary winding and said emitter-base paths, said resonant circuit having a relatively low impedance at the frequency of said input signal and having a resonant frequency at the frequency of said selected harmonic of said signal frequency, means for deriving an output signal from said transistors comprising an output transformer having a primary winding and a secondary winding, and means connecting the emitter-collector paths of said transistors in parallel across the primary winding of said output transformer.

References Cited in the file of this patent

UNITED STATES PATENTS

| | | |
|---|---|---|
| 1,971,235 | Rettenmeyer | Aug. 21, 1934 |
| 2,038,879 | Willans | Apr. 28, 1936 |
| 2,103,468 | Kreer | Dec. 28, 1937 |
| 2,115,858 | Keall | May 3, 1938 |
| 2,691,075 | Schwartz | Oct. 5, 1954 |
| 2,761,917 | Aronson | Sept. 4, 1956 |
| 2,782,267 | Beck | Feb. 19, 1957 |
| 2,805,289 | Buijs | Sept. 3, 1957 |
| 2,812,393 | Patrick | Nov. 5, 1957 |

FOREIGN PATENTS

| | | |
|---|---|---|
| 831,415 | Germany | Feb. 14, 1952 |

OTHER REFERENCES

Shea: "Transistor Circuits," published by John Wiley & Sons, Ltd., Sept. 15, 1953.